(12) United States Patent
Hwang

(10) Patent No.: US 7,215,471 B2
(45) Date of Patent: May 8, 2007

(54) DIFFRACTIVE OPTICAL ELEMENT, ILLUMINATION SYSTEM COMPRISING THE SAME, AND METHOD OF MANUFACTURING SEMICONDUCTOR DEVICE USING ILLUMINATION SYSTEM

(75) Inventor: Chan Hwang, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 327 days.

(21) Appl. No.: 10/874,786

(22) Filed: Jun. 22, 2004

(65) Prior Publication Data
US 2005/0046945 A1 Mar. 3, 2005

(30) Foreign Application Priority Data
Jul. 24, 2003 (KR) ............. 10-2003-0051118

(51) Int. Cl.
*G02B 27/44* (2006.01)
*G00B 5/18* (2006.01)
*G03H 1/00* (2006.01)

(52) U.S. Cl. .......... 359/566; 359/569; 359/571; 355/67

(58) Field of Classification Search ........ 359/566, 359/569, 571; 355/67, 71
See application file for complete search history.

(56) References Cited

U.S. PATENT DOCUMENTS
6,452,662 B2* 9/2002 Mulkens et al. ........... 355/67

* cited by examiner

*Primary Examiner*—Fayez G. Assaf
(74) *Attorney, Agent, or Firm*—F. Chau & Associates, LLC

(57) ABSTRACT

An illumination system including a diffractive optical element (DOE) having an uneven surface that produces an illumination shape. The DOE comprising an uneven surface that produces a multipole illumination shape having angular scope element, wherein the angular scope element is a function of a radius and an angle of the produced multipole illumination shape, and wherein a position of the poles and sizes of the poles in an angular scope vary with a radial scope used in producing the multipole illumination shape, and a method of manufacturing a semiconductor device using the system.

17 Claims, 7 Drawing Sheets

DIFFRACTIVE OPTICAL ELEMENT, ILLUMINATION SYSTEM COMPRISING THE SAME, AND METHOD OF MANUFACTURING SEMICONDUCTOR DEVICE USING ILLUMINATION SYSTEM

CROSS-REFERENCE TO RELATED APPLICATION

This application claims priority from Korean Patent Application No. 2003-51118, filed on Jul. 24, 2003, which is incorporated herein by reference in its entirety.

BACKGROUND

1. Field of the Invention

The present invention relates, generally, to an illumination system of a lithographic apparatus for fabricating a semiconductor device, and more particularly, to an illumination system using a diffractive optical element (DOE) that provides a multipole illumination.

2. Description of the Related Art

Generally, a lithographic apparatus having an illumination system is used to obtain optimized illumination conditions for forming a fine pattern on a semiconductor device. For example, FIG. 1 is a schematic diagram of a conventional illumination system including a conventional diffractive optical element (DOE). Referring to FIG. 1, a conventional illumination system 100 includes a conventional DOE 10. The DOE 10 divides a laser beam 5 projected from a light source (not shown) into several beams, determines the mutual angles of the divided beams, and provides a multipole illumination shape such as a quadrupole, dipole, or cross-pole. FIG. 2 illustrates a cross-sectional view of the conventional DOE in FIG. 1. Referring to FIG. 2, the DOE 10 is a non-spherical, light-diffracting device equipped with an uneven surface 13 formed with a predetermined pitch and depth on a surface of a base material 11.

The illumination system 100 produces the quadrupole illumination 15 by projecting the laser beam 5 through the DOE 10. An inner and outer sigma σ of the quadrupole illumination 15 are determined when passing through a zoom lens 20. Thereafter, the quadrupole illumination 15 is reflected by mirrors M1 and M2 and passes through a condenser lens 25, which condenses the quadrupole illumination 15. Then, the condensed quadrupole illumination is directed to a reticle 30 where a mask pattern of the reticle 30 is projected onto a wafer 40 by a projection lens 35.

The advantage of the lithographic apparatus having the above illumination system 100 is that light intensity does not decrease since an aperture, which blocks part of the light, for forming the multipole is not required. In addition, the poles may be enlarged or reduced, and the poles radial scope can be changed by the zoom lens 20.

However, once the illumination condition, that is the quadrupole, dipole, cross-pole, etc., is fixed by the DOE 10, a position of the poles in an angular scope and the relative sizes of the poles cannot be adjusted.

FIG. 3 illustrates the shape of the quadrupole illumination 15 produced by the DOE of FIG. 1. In this case, an illumination shape I(r, θ) can be expressed by multiplying a radial scope element A(r) by an angular scope element C(θ) where (r, θ) are polar coordinates. A(r) is 1 if $r_{inner} < r < r_{outer}$, otherwise A(r) is 0. C(θ) is 1 if b<θ<c, otherwise C(θ) is 0 (b and c are constants). The position of the poles in the angular scope is fixed at (b+c)/2 independent of $r_{inner}$ and $r_{outer}$. The conventional quadrupole illumination 15 has four poles 15a, 15b, 15c, and 15d, each located in a different quadrant of the xy-plane and being symmetric about the x and y axes.

FIG. 4 shows a shape of a conventional cross-pole illumination 55 produced by another conventional DOE. In this case, an illumination shape I(r,e) can be expressed by multiplying the radial scope element A(r) and the angular scope element C(θ), wherein (r,θ) are polar coordinates. A(r) is 1 only if $r_{inner} < r < r_{outer}$, otherwise A(r) is 0. C(θ) is 1 if 0<θ<b and d<θ<π/2, otherwise C(θ) is 0. A ratio of areas between the poles, b/(π/2-d)=1, is fixed. That is, angles between poles 55a, 55b, 55c, and 55d are each π/2, and these poles are located on the x and y axes.

As a consequence, the illumination shapes formed by the conventional DOEs depend on C(θ), which is only a function of θ, and has no dependence on r. Thus, even if the radial scope used is changed, the position of the poles in the angular scope and the relative sizes of the poles do not change. Accordingly, the conventional DOE has little pliability. Furthermore, in order to design the optimized illumination, each pole may be required to have a different size. However, it is very difficult to embody other illumination conditions by using the conventional DOE, which already embodies the optimized illumination condition.

Thus, problems in conventional DOEs include the small amount of pliability due to the fixed illumination mode, difficulty of changing a position and sizes of the poles, and difficulty of selecting and combining the illumination conditions.

Therefore, a need exists for a diffractive optical element (DOE) that produces a multipole illumination shape and is capable of changing a position of poles and sizes of the poles of the multipole illumination shape depending on a radial scope used.

SUMMARY OF THE INVENTION

Exemplary embodiments of the present invention provide diffractive optical elements (DOEs) that produce a multipole illumination shape and are capable of changing sizes and a position of poles of the multipole illumination shape depending on a radial scope used.

In an aspect of the present invention, a multipole illumination shape is produced using a DOE. In another aspect of the present invention, an illumination system for manufacturing a semiconductor device is provided that is capable of changing the position of the poles in the angular direction and the sizes of the poles according to the radial scope used in producing the multipole illumination shape.

According to an exemplary embodiment of the present invention, a diffractive optical element (DOE) is provided that produces a multipole illumination shape for a lithographic process for a semiconductor device. The DOE comprises an uneven surface that produces a multipole illumination shape having an angular scope element that is a function of a radius and an angle of the produced multipole illumination shape so that a position and size of poles of the multipole illumination shape vary with the radial scope used.

According to another exemplary embodiment, the DOE having an uneven surface produces a multipole illumination shape in which the size of each of the poles change according to the radial scope used. The multipole illumination shape is a cross-pole illumination shape, and as the radial scope used approaches an origin, the poles located on a y-axis increase in size and poles on an x-axis decrease in size.

According to another exemplary embodiment, the DOE having uneven surface produces a multipole illumination shape having poles in an angular scope in which a position of the poles in the angular scope change according to a radial scope used. The DOE having uneven surface may also produce a multipole illumination shape in which the position of poles is closer to an x-axis as the radial scope used approaches the origin.

According to yet another exemplary embodiment of the present invention, an illumination system for manufacturing a semiconductor device comprises a light source, a diffractive optical element (DOE) having an uneven surface that divides a light beam output from the light source to produce a first multipole illumination shape, wherein the DOE determines the mutual angles between poles of the first multiple illumination shape, a variable magnification zoom lens that magnifies the first multipole illumination shape from the DOE, an annular aperture, which selectively allows the magnified first multipole illumination shape to pass, thereby producing a second multiple illumination shape, and a condenser lens that condenses the second multipole illumination shape and directs the second multipole illumination shape to a reticle, wherein the DOE, which produces the first multipole illumination shape having both angular and radial directions, used in combination with the variable magnification zoom lens and the annular aperture to produce the second multipole illumination shape that depends on the radial scope used in producing the first multipole illumination shape.

These and other exemplary embodiments, features, aspects and advantages of the present invention will become more apparent by the following detail description exemplary embodiments when read in conjunction with the accompany drawings.

DETAILED DESCRIPTION OF EXEMPLARY EMBODIMENTS

Figure 1:
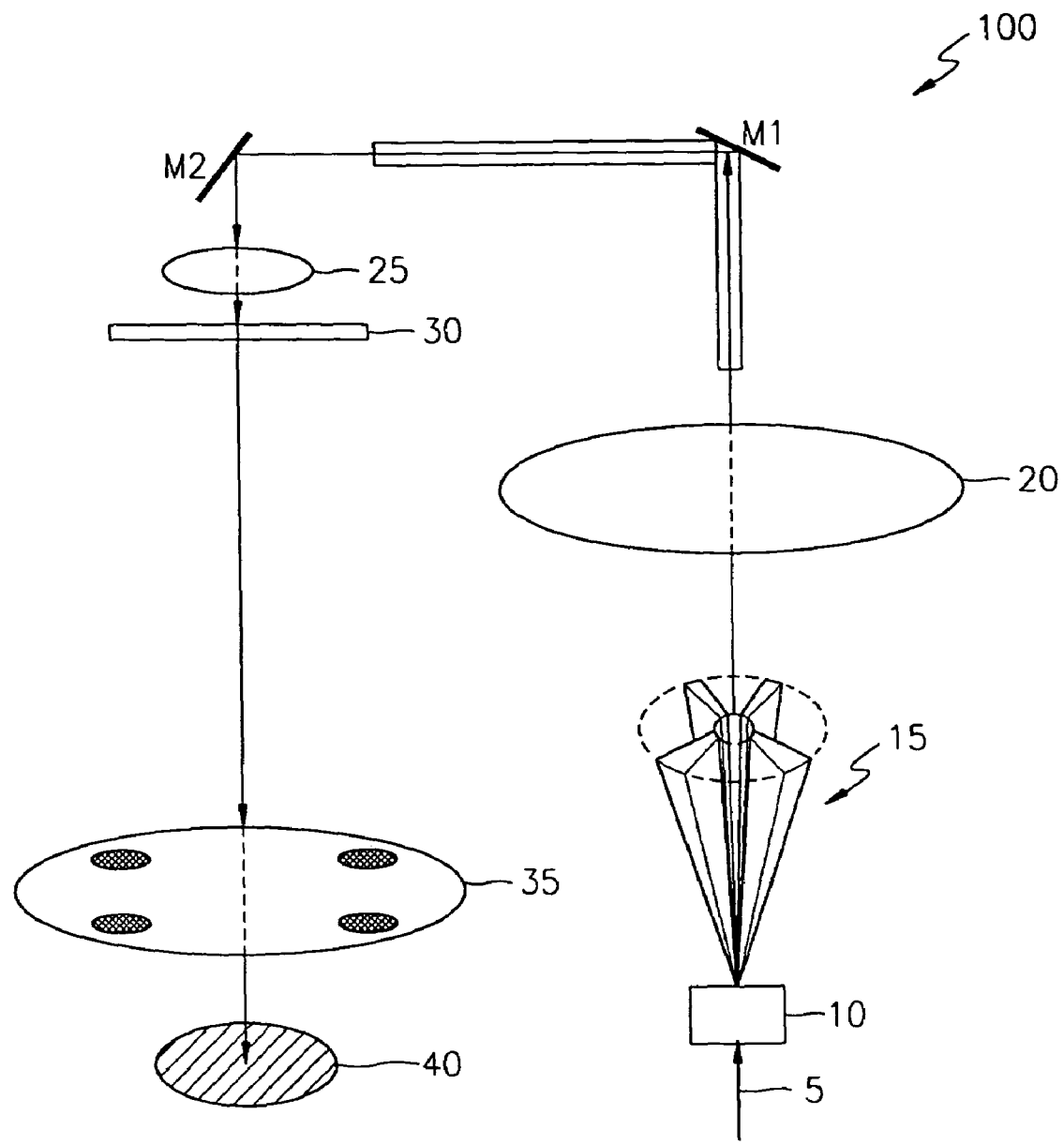
FIG. 1 is a schematic diagram of a conventional illumination system including a conventional diffractive optical element (DOE).
Figure 2:
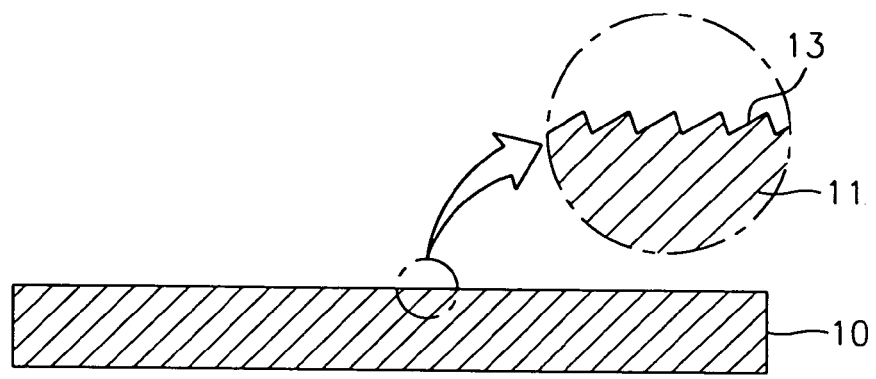
FIG. 2 illustrates a cross-sectional view of the conventional DOE of FIG. 1.

The present invention will now be described more fully with reference to the attached drawings, in which exemplary embodiments of the present invention are shown. This invention may, however, be embodied in many different forms and should not be construed as being limited to the exemplary embodiments set forth herein; rather these exemplary embodiments are provided so that this disclosure will be thorough and complete, and will fully convey the concept of the invention to those skilled in the art. In the drawings, the forms of elements are exaggerated for clarity. To facilitate understanding, identical reference numerals have been used for like elements throughout the figures.

Examples that will be described below are specific examples of multipole illumination such as quadrupole and cross-pole illumination. However, other illumination modes with more poles may be embodied by a diffractive optical element (DOE) according to the present invention.

Figure 5:
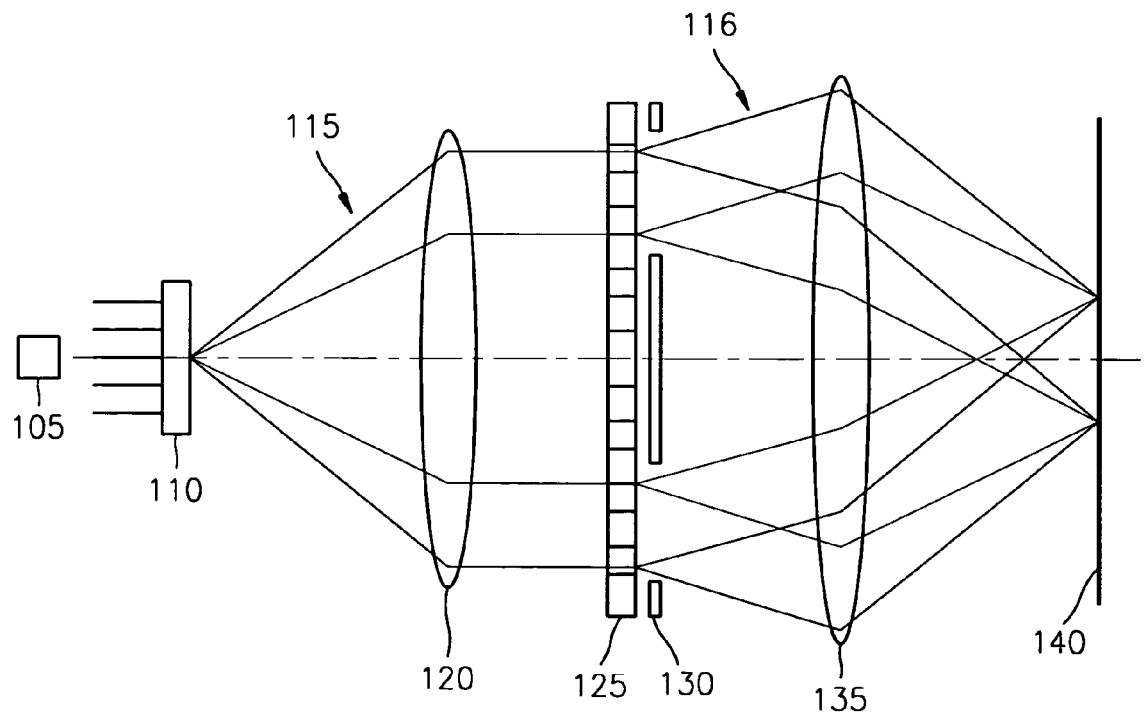
FIG. 5 is a schematic diagram of an illumination system for manufacturing a semiconductor device, according to an exemplary embodiment of the present invention.

FIG. 5 is a schematic diagram of an illumination system for manufacturing a semiconductor device according to an exemplary embodiment of the present invention. Referring to FIG. 5, a DOE 110 having an uneven surface divides light from a laser light source 105 into several beams and defines mutual angles of the beams to form a first multipole illumination shape 115. The multipole illumination shape 115 is magnified by passing through a variable magnification zoom lens 120. The first multipole illumination shape 115 is then given a uniform intensity by a uniformizing lens 125, and the radial scope of the first multipole illumination shape 115 is determined when passing through an annular aperture 130 to form a second multipole illumination shape 116. Thereafter, the second multipole illumination shape 116 is directed to a light-focusing lens 135 and is projected onto a reticle 140 that has a mask pattern. Thus, the DOE 110 having an uneven surface, which produces a first illumination shape 115 that is dependent on both the angular and radial scopes, is used in combination with the variable magnification zoom lens 120 and the annular aperture 130 to produce a second multipole illumination shape 116 that depends on the radial scope of the first illumination shape 115.

In order to manufacture the semiconductor device using the illumination system, a substrate (not shown) covered by a photosensitive film is placed under the reticle 140, and then the mask pattern of the reticle 140 is projected onto the photosensitive film. Different illumination shapes are formed by changing the radial scope of the first illumination shape 116 by utilizing the combination of the variable magnification zoom lens 120 and the annular aperture 130. By this process, an optimized illumination can be selected according to the mask pattern.

The radial position of each pole can be changed by adjusting the variable magnification zoom lens 120 and the annular aperture 130, and a radial width of each pole can be adjusted by coordinating the variable magnification zoom lens 120 and the annular aperture 130. In these cases, the first multipole illumination shape output from the DOE 110 is fixed as a function of the mutual angle.

Figure 6:
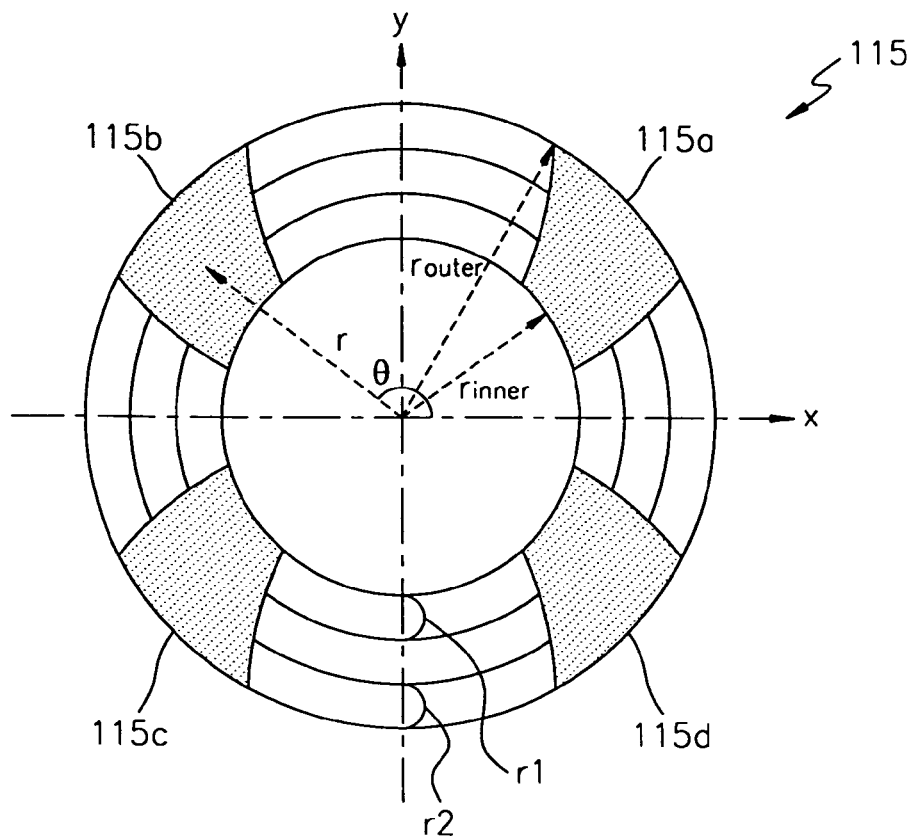
FIG. 6 illustrates a first multipole illumination shape output from the DOE of FIG. 5.

FIG. 6 illustrates the first multipole illumination shape 115 output from the DOE of FIG. 5, according to an exemplary embodiment of the present invention.

As illustrated in FIG. 6, the first multipole illumination shape 115 is related to the quadrupole illumination, and shapes of poles 115a, 115b, 115c, and 115d are dependent on the radial scope.

An illumination shape $I(r, \theta)$ can be expressed by multiplying a radial scope element $A(r)$ and an angular scope element $C(r, \theta)$, wherein $(r, \theta)$ are polar coordinates. $A(r)$ is 1 if $r_{inner}<r<r_{outer}$, otherwise $A(r)$ is 0. $C(r, \theta)$ is 1 if $ar+b<\theta<ar+c$, (a, b and c are constants), otherwise $C(r, \theta)$ is 0. In this case, $a>0$, $b<c$, and an effective pole position $(2ar+b+c)/2$ is not fixed but is a function of r. If these conditions are input into a DOE design program, an uneven surface can be designed for dividing beams and determining the beams mutual angles in order to obtain the first multipole illumination shape 115. A method of manufacturing the DOE by applying a DOE design, including etching, machine processing, epoxy injection, injection molding, etc., is well known to those skilled in the art. Preferably, Polymethyl methacrylate (PMMA) can be used for the base material of the DOE, and the DOE is formed by etching.

Figure 7A:
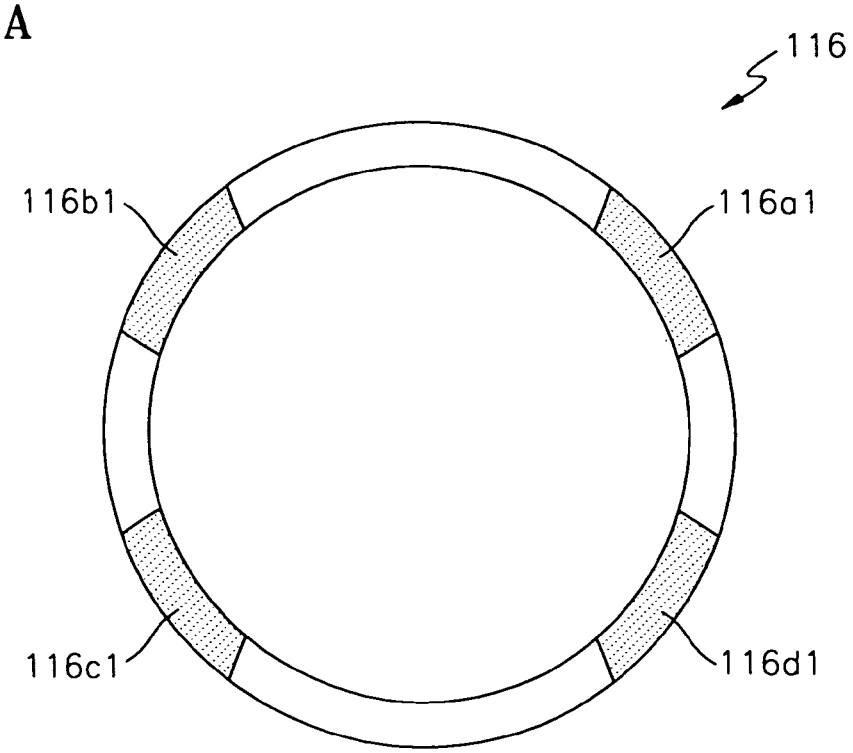
FIGS. 7A and 7B illustrate various second multipole illumination shapes resulting from the first multipole illumination shape in FIG. 6, according to another exemplary embodiment of the present invention.
Figure 7B:
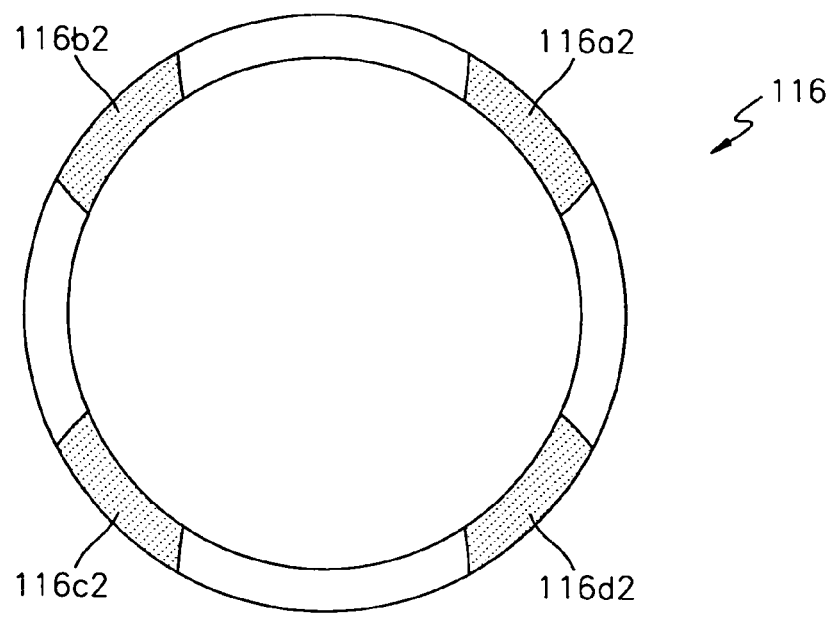

FIGS. 7A and 7B illustrate various second multipole illumination shapes resulting from the first multipole illumination shape 115 in FIG. 6, according to another exemplary embodiment of the present invention.

The second multipole illumination shape in FIG. 7A is obtained by installing the DOE capable of producing the first multipole illumination shape 115 in the illumination system in FIG. 5 and adjusting the variable magnification zoom lens 120 such that a section of r1 of the first multipole illumination shape 115 passes through the annular aperture 130. FIG. 7B is obtained by adjusting the variable magnification zoom lens 120 such that a section of r2 of the first multipole illumination shape 115 passes through the annular aperture 130.

When the section r1 of the first multipole illumination shape 115 passes through the annular aperture 130, poles 116a1, 116b1, 116c1, 116d1 are located near the x-axis. However, when the section r2 of the first multipole illumination shape 115 passes through the annular aperture 130, poles 116a2, 116b2, 116c2, and 116d2 are located far from the x-axis. Therefore, according to an exemplary embodiment of the present invention, the position of each of the poles in the angular scope depends on the radial scope used in producing the illumination shape.

Figure 3:
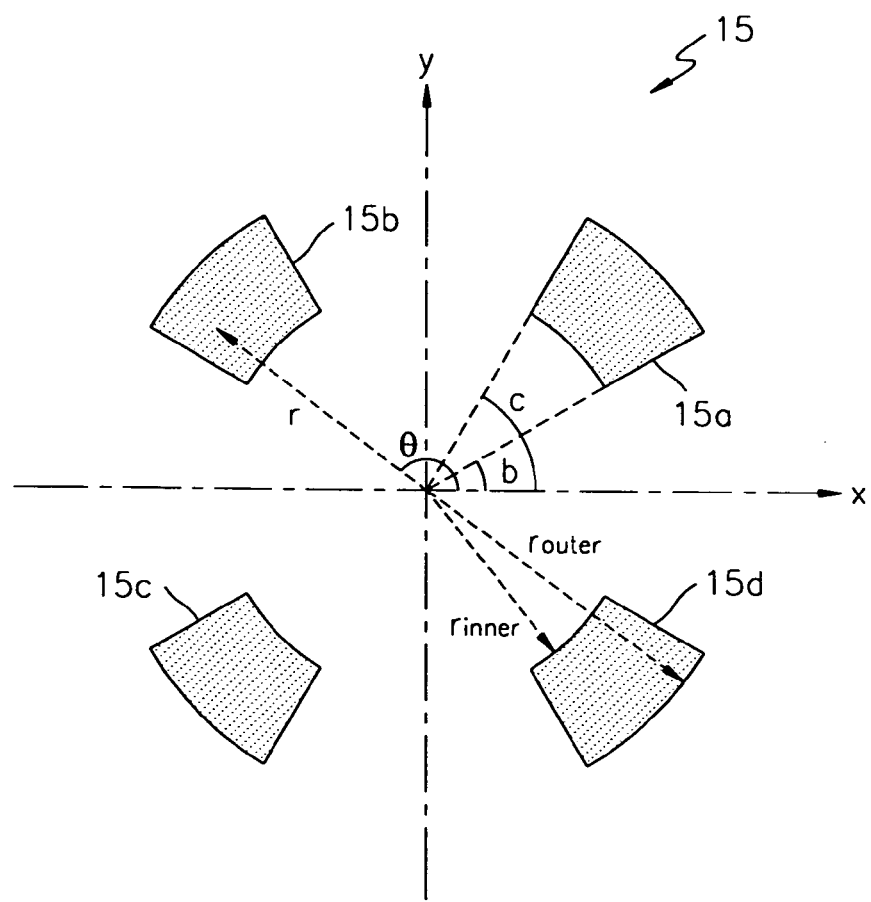
FIG. 3 illustrates a shape of quadrupole illumination produced by the conventional DOE of FIG. 1.

However, if the conventional quadrupole illumination 15 in FIG. 3 is used in the illumination system of the exemplary embodiment of the present invention, the position of the poles does not change. In other words, the position of the poles in the conventional quadrupole illumination does not depend on the radial scope of the illumination shape used, and the position of the poles does not change regardless of the combination of the variable magnification zoom lens 120 and the annular aperture 130.

Figure 8:
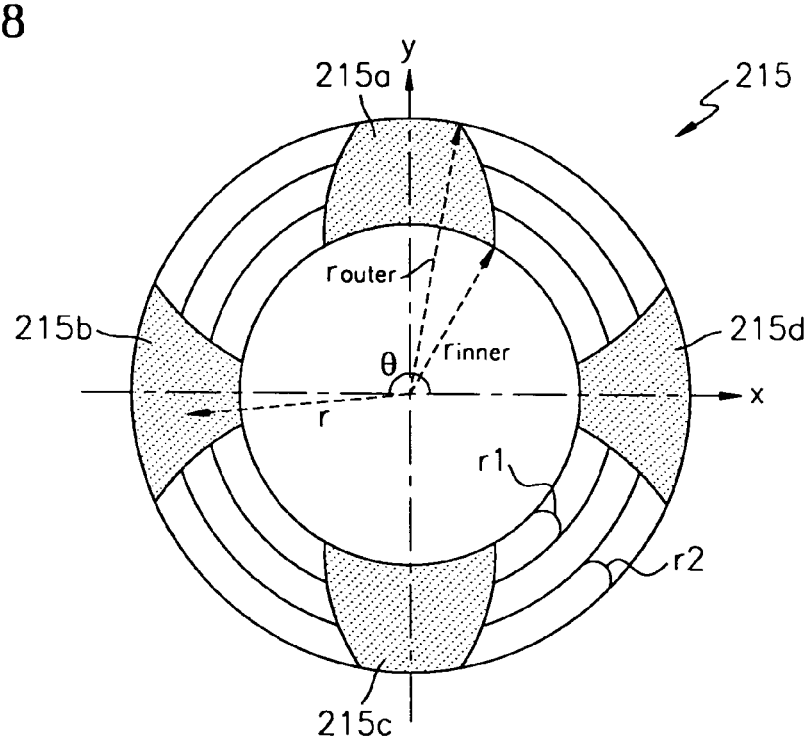
FIG. 8 illustrates a first multipole illumination shape output from a DOE, according to yet another exemplary embodiment of the present invention.

FIG. 8 illustrates a first multipole illumination shape 215 output from a diffractive optical element (DOE), according to yet another embodiment of the present invention. Referring to FIG. 8, the first multipole illumination shape 215 is related to cross-pole illumination. The widths of poles 215a and 215c decrease as the radius increases, while the widths of poles 215b and 215d increase as the radius increases. This illumination shape, which is expressed as $I(r, \theta)$ where $(r, \theta)$ are polar coordinates, has a radial scope element $A(r)$ and an angular scope element $C(r, \theta)$. $A(r)$ is 1 if $r_{inner}<r<r_{outer}$, otherwise $A(r)$ is 0. $C(r, \theta)$ is 1 if $0<\theta<ar+b$ and $cr+d<\theta<\pi/2$, (a,b,c, and d are constants), otherwise $C(r, \theta)$ is 0. In this case, $a>0$, $c<0$, and an effective pole position $(ar+b)/(\pi/2-(cr+d))$ between adjacent poles is not fixed but changed as a function of r.

Figure 9A:
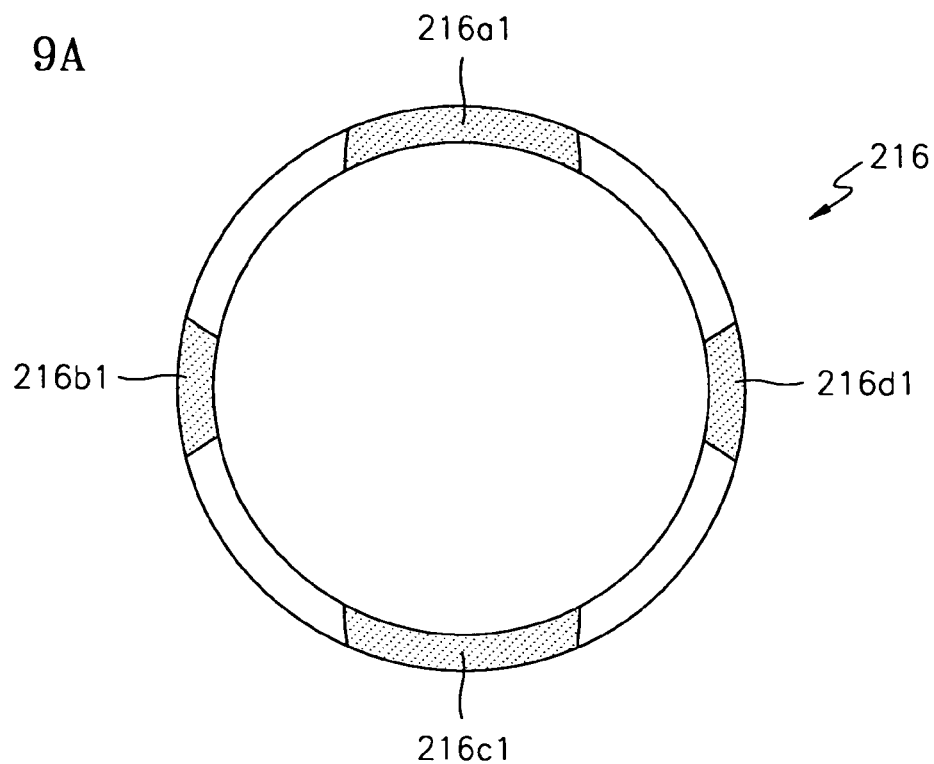
FIGS. 9A and 9B illustrate various second multipole illumination shapes resulting from the first multipole illumination shape in FIG. 8, according to still another exemplary embodiment of the present invention.
Figure 9B:
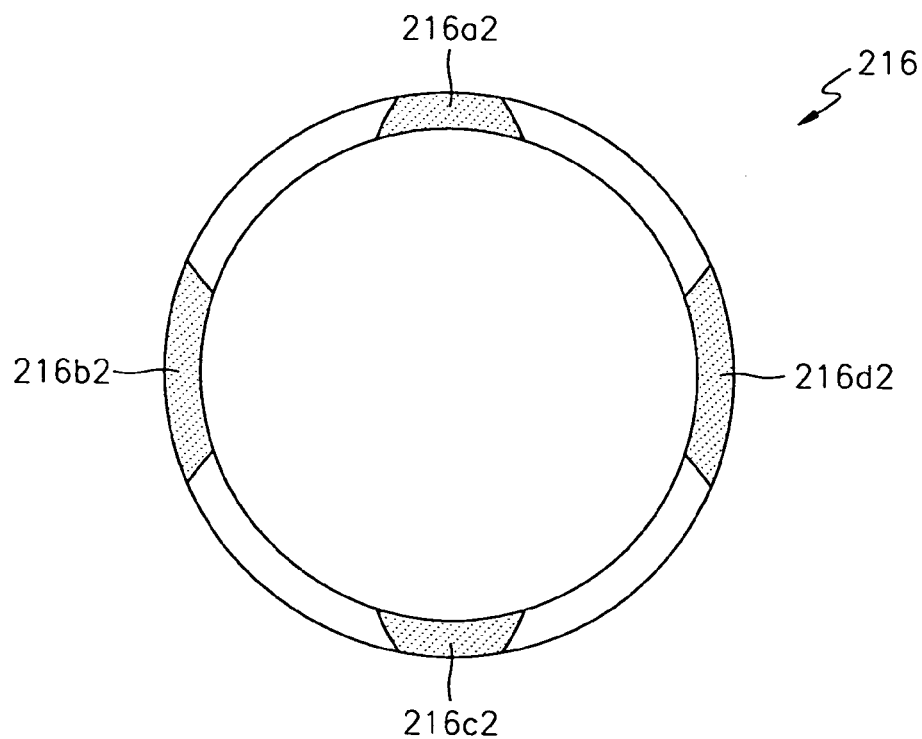

FIGS. 9A and 9B illustrate various second multipole illumination shapes resulting from the first multipole illumination shape in FIG. 8, according to still another exemplary embodiment of the present invention.

The second multipole illumination shape in FIG. 9A is obtained by installing a DOE capable of producing the first multipole illumination shape 215 in the illumination system in FIG. 5 and by adjusting the variable magnification zoom lens 120 such that a section of r1 of the first multipole illumination shape 215 passes through the annular aperture 130. The second multipole illumination shape of FIG. 9B is obtained by adjusting the variable magnification zoom lens 120 such that a section of r2 of the first multipole illumination shape 215 passes through the annular aperture 130.

When the section of r1 of the first multipole illumination shape 215 passes through the annular aperture 130, poles 216a1 and 216c1 located on the y-axis are larger than poles 216b1 and 216d1 located on the x-axis. However, when the section r2 of the first multipole illumination shape 215 passes through the annular aperture 130, the poles 216a2 and 216c2 located on the y-axis are smaller than the poles 216b2 and 216d2 located on the x-axis. Therefore, the relative sizes of the poles change according to the radial scope of the first multipole illumination shape 215 passing through the annular aperture 130.

Figure 4:
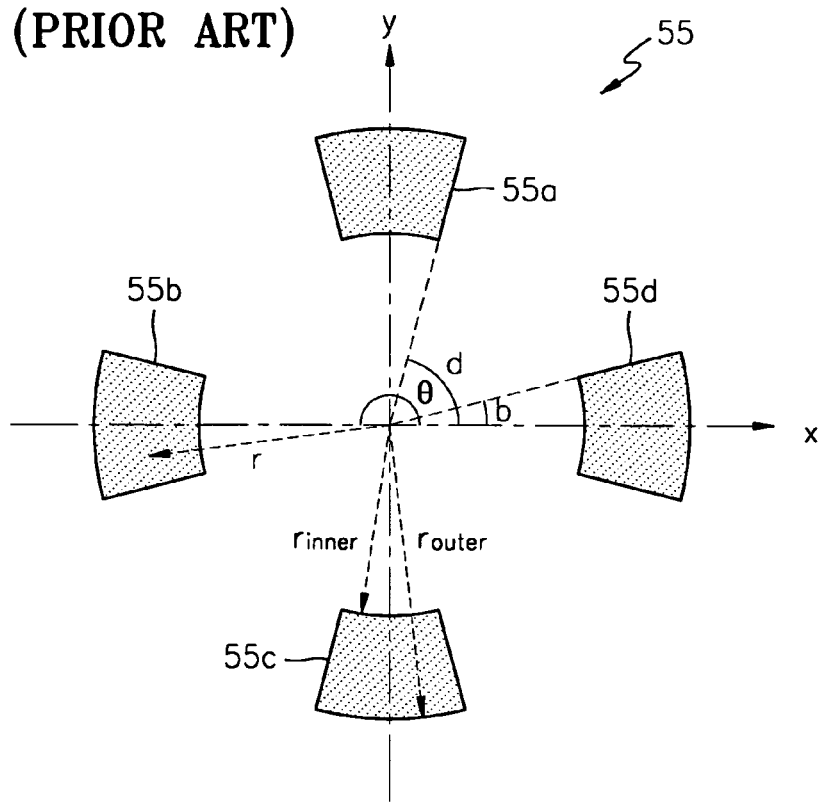
FIG. 4 illustrates a shape of cross-pole illumination produced by another conventional DOE.

However, if the conventional cross-pole illumination 55 in FIG. 4 is used in the illumination system of the exemplary embodiments of present invention, the relative sizes of the poles do not change because the poles are independent of the radial scope used of the illumination shape. In other words, the size of the poles of the conventional cross-pole illumination 55 does not change regardless of the combination of the variable magnification zoom lens 120 and the annular aperture 130.

Figure 10A:
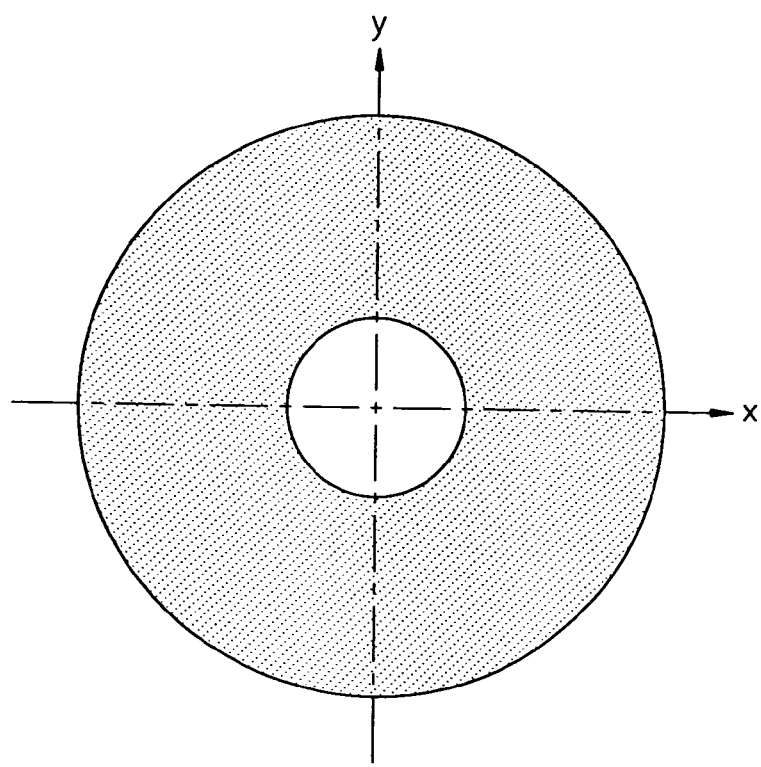
FIGS. 10A is an annular illumination shape, according to still yet another exemplary embodiment of the present invention.
Figure 10B:
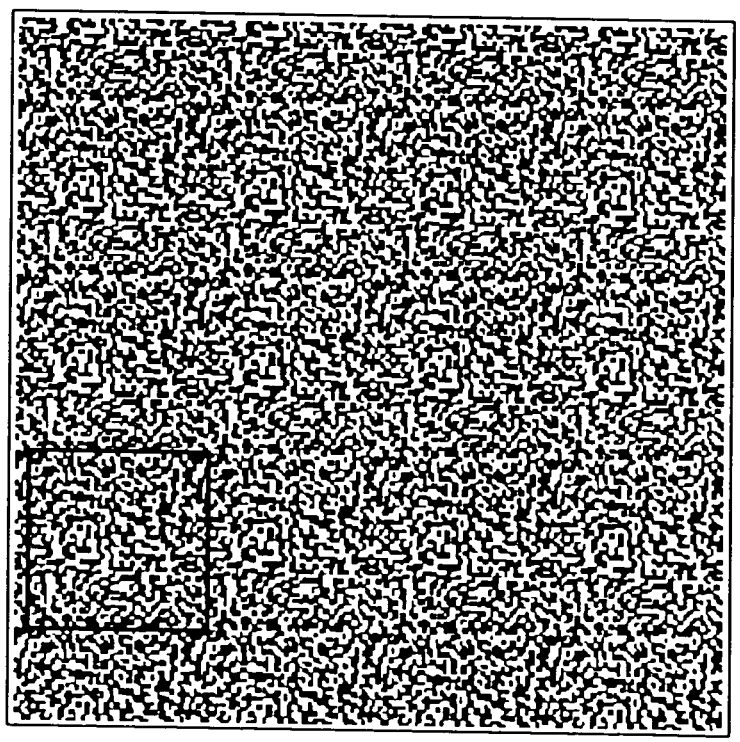
FIG. 10B is a top plane view of a DOE, according to another exemplary embodiment of the present invention.

FIG. 10A is an annular illumination shape, and FIG. 10B is a top plane view of a DOE, according to still yet another exemplary embodiment of the present invention.

In order to manufacture a DOE that will produce the annular illumination shape in FIG. 10A, an equation reflecting this illumination is input into the DOE design program. That is, the annular illumination shape is expressed as $I(r)$ where $I(r)$ is 1 if $r_{inner}<r<r_{outer}$, otherwise $I(r)$ is 0. If this equation is input in the DOE design program, an uneven surface as shown in FIG. 10B is obtained. If the design program is used to form the uneven surface in a base material, e.g., polymethyl methacrylate (PMMA), of the DOE, the annular illumination shape of FIG. 10A is produced. This method is well known to those skilled in the art. Thus, the DOE according to the present invention, based on the explanations with reference to FIGS. 6 and 8, can also be manufactured.

A DOE according to an exemplary embodiment of the present invention generates a multipole illumination shape with poles that have a width that is dependent on the radial scope used in producing the multipole illumination shape. A DOE, according to another exemplary embodiment of the present invention, generates a multipole illumination shape that includes poles with varying sizes and positions that are dependent on the radial scope. Thus, it is noted that it is not a simple modification in designing. Also, it is preferable that the DOE according to exemplary embodiments of the present invention be used in the illumination system of a lithographic apparatus. However, the DOE may also be used in illumination systems such as cameras and observation apparatus.

The positions and the relative sizes of the poles are controlled by the combination of the variable magnification zoom lens, the annular aperture, and a DOE according to the exemplary embodiments of the present invention. This feature is very useful for enlarging the lithographic apparatus and reducing the amount of trial and error when designing an optimal illumination condition. A process latitude of the lithographic apparatus is also improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A diffractive optical element (DOE) for a lithographic process, the DOE comprising an uneven surface that produces a multipole illumination shape I(r, θ) expressed by multiplying a radial scope element A(r) and an angular scope element C(r, θ), wherein r and θ are a radius and an angle of polar coordinates, respectively, and θ is dependent on r, and wherein a position of the poles and sizes of the poles in an angular scope vary with a radial scope used in producing the multipole illumination shape.

2. The DOE of claim 1, wherein the size of each of the poles varies according to the radial scope used.

3. The DOE of claim 2, wherein the multipole illumination shape is a cross-pole illumination shape, and wherein the poles located on a y-axis increase in size and the poles on an x-axis decrease in size as the radial scope used in producing the multipole illumination shape approaches an origin.

4. The DOE of claim 2, wherein A(r) is 1 if $r_{inner} < r < r_{outer}$, otherwise A(r) is 0, and C(r, θ) is 1 if 0<θ<ar+b and cr+d<θ<π/2, otherwise C(r, θ) is 0, a>0 and c<0, and a size ratio (ar+b)/(π/2−(cr+d)) between adjacent poles, is a function of r.

5. The DOE of claim 1, wherein the position of the poles in an angular direction varies according to the radial scope used.

6. The DOE of claim 5, wherein the position of the poles are closer to an x-axis as the radial scope used approaches an origin.

7. The DOE of claim 5, wherein the multipole illumination shape is given by I(r, θ), which is expressed by multiplying a radial scope element A(r) and an angular scope element C(r, θ), where (r, θ) are polar coordinates, and wherein A(r) is 1 if $r_{inner} < r < r_{outer}$, otherwise A(r) is 0, and C(r, θ) is 1 if ar+b<θ<ar+c, otherwise C(r, θ) is 1, a>0 and b<c, and a pole position of the poles (2ar+b+c)/2 is a function of r.

8. The DOE of claim 1, wherein the illumination shape is quadrupole or cross-pole.

9. An illumination system for manufacturing a semiconductor device, the system comprising:
   a light source;
   a diffractive optical element (DOE) having an uneven surface that divides a light beam output from the light source to produce a first multipole illumination shape, wherein the DOE determines the mutual angles between poles of the first multiple illumination shape;
   a variable magnification zoom lens that magnifies the first multipole illumination shape from the DOE;
   an annular aperture, which selectively allows the magnified first multipole illumination shape to pass, thereby producing a second multiple illumination shape; and
   a condenser lens that condenses the second multipole illumination shape and directs the second multipole illumination shape to a reticle,
   wherein the DOE, which produces the first multipole illumination shape having both angular and radial directions, is used in combination with the variable magnification zoom lens and the annular aperture to produce the second multipole illumination shape that depends on the radial scope used to produce the first multipole illumination shape.

10. The illumination system of claim 9, wherein the sizes of the poles of the first multipole illumination shape vary according to the radial scope used.

11. The illumination system of claim 10, wherein the first multipole illumination shape is a cross-pole illumination shape, and wherein the poles located on a y-axis increase in size and the poles on an x-axis decrease in size as the radial scope used to produce the multipole illumination shape approaches an origin.

12. The illumination of claim 10, wherein the first multipole illumination shape is given by I(r, θ), which is expressed by multiplying a radial scope element A(r) and an angular scope element C(r, θ), where (r, θ) are polar coordinates, and A(r) is 1 if $r_{inner} < r < r_{outer}$, otherwise A(r) is 0, and C(r, θ) is 1 if 0<θar+b and cr+d<θ<π/2, otherwise C(r, θ) is 0, a>0 and c<0, and a size ratio between adjacent poles, (ar+b)/(π/2−(cr+d)), is a function of r.

13. The illumination system of claim 9, wherein the DOE produces the first multipole illumination shape in which each position of the poles in an angular direction varies according to the radial scope used to produce the first multipole illumination shape.

14. The illumination system of claim 13, wherein the DOE produces the first multipole illumination shape in which each position of the poles is closer to an x-axis as the radial scope approaches the origin.

15. The illumination system of claim 13, wherein the first multipole illumination shape is given by I(r, θ), which is expressed by multiplying a radial scope element A(r) and an angular scope element C(r, θ), where (r, θ) are polar coordinates and A(r) is 1 if $r_{inner} < r < r_{outer}$, otherwise A(r) is 1, and C(r, θ) is 1 if ar+b<θ<ar+c, otherwise C(r, θ) is 1, a>0 and b<c, and an effective pole position of the poles (2ar+b+c)/2 is a function of r.

16. The illumination system of claim 9, wherein the first illumination shape is quadrupole or cross-pole.

17. The illumination system of claim 9, further comprising a uniformizing lens for uniformizing an intensity of the magnified first illumination shape.

* * * * *